US007460572B2

(12) United States Patent
Kawai et al.

(10) Patent No.: US 7,460,572 B2
(45) Date of Patent: Dec. 2, 2008

(54) OPTICAL MODULE AND METHOD FOR MONITORING AND CONTROLLING WAVELENGTHS

(75) Inventors: Shingo Kawai, Funabashi (JP); Hideo Kawada, Narashino (JP); Naoto Yoshimoto, Chiba (JP); Toru Ogawa, Chiba (JP); Katsumi Iwatsuki, Yokohama (JP)

(73) Assignee: Nippon Telegraph and Telephone Corporation (JP)

( * ) Notice: Subject to any disclaimer, the term of this patent is extended or adjusted under 35 U.S.C. 154(b) by 265 days.

(21) Appl. No.: 10/534,770

(22) PCT Filed: May 13, 2004

(86) PCT No.: PCT/JP2004/006767

§ 371 (c)(1),
(2), (4) Date: May 13, 2005

(87) PCT Pub. No.: WO2004/102754

PCT Pub. Date: Nov. 25, 2004

(65) Prior Publication Data

US 2006/0145051 A1 Jul. 6, 2006

(30) Foreign Application Priority Data

May 13, 2003 (JP) .............................. 2003-135168

(51) Int. Cl.
*H01S 5/0687* (2006.01)
(52) U.S. Cl. .............................. 372/29.02; 372/29.021; 372/32; 372/34; 372/20
(58) Field of Classification Search .................. 372/34, 372/32, 29.021, 29.02
See application file for complete search history.

(56) References Cited

U.S. PATENT DOCUMENTS 5,185,643 A 2/1993 Vry et al.

(Continued)

FOREIGN PATENT DOCUMENTS

EP 1156563 A2 11/2001

(Continued)

OTHER PUBLICATIONS

Richard Burden et al., Numerical Analysis. Boston: Prindle, Weber & Schmidt, Inc., 1978.*

(Continued)

*Primary Examiner*—Minsun Harvey
*Assistant Examiner*—Michael Carter
(74) *Attorney, Agent, or Firm*—Fitch, Even, Tabin & Flannery

(57) ABSTRACT

The present invention provides wavelength monitoring and/or control enabling size reduction and low power operation without requiring a complicated optical system in its wavelength monitoring and controlling mechanism.

The measurement portion (1) measures temperature by a thermistor (5) in the measurement portion, and measures a bias current by using an LD drive current detecting circuit (6). The LD temperature, optical output and bias current are measured by the measurement portion. The relationship between the LD temperature and wavelengths or between the temperature, bias current and wavelengths is stored in a memory map of the storage portion (2). The central controlling portion (3) calculates wavelengths on the basis of the temperature and the bias current or the temperature information of the measurement portion, and the relationship between the LD temperature, bias current and wavelengths or between the temperature and wavelengths of the storage portion.

6 Claims, 12 Drawing Sheets

U.S. PATENT DOCUMENTS

| | | | |
|---|---|---|---|
| 6,104,526 | A | 8/2000 | Kakui |
| 6,353,623 | B1 | 3/2002 | Munks et al. |
| 6,393,041 | B1 * | 5/2002 | Sato .................. 372/29.021 |
| 2003/0152390 | A1 * | 8/2003 | Stewart et al. ............. 398/135 |
| 2004/0114646 | A1 * | 6/2004 | Stewart et al. ............... 372/34 |

FOREIGN PATENT DOCUMENTS

| | | |
|---|---|---|
| EP | 1345296 A1 | 9/2003 |
| JP | 01-235390 | 9/1989 |
| JP | 01-238083 A | 9/1989 |
| JP | 04-354217 A | 12/1992 |
| JP | 09-214038 | 8/1997 |
| JP | 2000-323785 | 11/2000 |
| JP | 2001-196689 | 7/2001 |
| JP | 2001-230489 A | 8/2001 |
| JP | 2003-283044 | 10/2003 |
| WO | 2006039530 A2 | 4/2006 |

OTHER PUBLICATIONS

Nicholas Chrisman, "Glossary for exploring Geographic Information Systems," 1997, John Wiley and Sons, <http://www.wiley.com/college/chrisman/glossary.html>.*

Nasu, H.; Mikaihara, T; Takagi, T..; Oike, M.; Nomura, T. and Kasukawa, A., 25GHz- spacing wavelength monitor integrated DFB laser module, for DWDM Applications, IEEE Photonics Technology Letters, vol. 15, No. 2, Feb. 2003, pp. 293-295.

Chung, Y. C. and Stulz, L. W., Synchronized Etalon Filters for Standardizing WDM Transmitter Laser Wavelengths, IEEE Photonics Technology Letters, vol. 5, No. 2, Feb. 1993, pp. 186-189.

Takagi, Tomohiro; Nasu, Hideyuki; Mukaihara, Toshikazu; Nomura, Takehiko; Kasukawa, Akihiko; Oike, Mizuki; Matsuura, Hiroshi; Shiba, Takaai; and Ninomiya, Takao, 25GHz-spacing wavelength monitor integrated DFB laser module, Institute of Electronics, Information and Communication Engineers, C-4-44, 2002.

* cited by examiner

FIG.2A

| TEMPERAT-URE(°C) \ BIAS CURRENT (mA) | | · | · | 50 mA | 60 mA | 70 mA | · | |
|---|---|---|---|---|---|---|---|---|
| | | | | | | | | |
| · | | | | | | | | |
| · | | | | | | | | |
| 24 °C | | | | 1544.94nm | 1544.97nm | 1545.00nm | | |
| 25 °C | | | | 1545.03nm | 1545.06nm | 1545.09nm | | |
| 26 °C | | | | 1546.12nm | 1545.15nm | 1545.18nm | | |
| | | | | | | | | |

FIG.2B

| TEMPERAT-URE(°C) | WAVE-LENGTH(nm) |
|---|---|
| | |
| | |
| 24 °C | 1545.0nm |
| 25 °C | 1545.1nm |
| 26 °C | 1545.2nm |
| | |

# OPTICAL MODULE AND METHOD FOR MONITORING AND CONTROLLING WAVELENGTHS

TECHNICAL FIELD

The present invention relates to an optical module, a wavelength monitoring method, and a wavelength monitoring and controlling method thereof. In further detail, the invention relates to a wavelength monitoring method in an optical transmitter module and an optical transmitter and receiver module, a wavelength controlling method and a wavelength monitoring and control method in an optical transmitter module and an optical transmitter and receiver module.

BACKGROUND ART

In recent years, an increase in the transmission capacity of a transmission line has been demanded in line with an increase in Internet traffic. To meet this demand, a wavelength division multiplexing technology (WDM) which is capable of transmitting data with different wavelengths bundled by a single core fiber has been introduced centering on the core network. Herein, where the WDM technology is employed, an optical coupling and splitting filter having a satisfactory wavelength selection property is needed since different wavelengths transmit respectively individual types of information.

In addition, since crosstalk between signals of different wavelengths becomes a factor of signal deterioration, it is necessary that the wavelength of a laser diode (LD) which is used as a signal source is stabilized in a passband of an optical coupling and splitting filter. In particular, in a Dense WDM (DWDM) technology having high density, since the pass band of the optical coupling and splitting filter is narrow, it is necessary to carry out wavelength monitoring and control.

Since the accuracy of monitoring and controlling the wavelength depends on an interval between wavelengths, the accuracy in wavelengths is made severe in line with narrowing of the interval between wavelengths. For example, in the DWDM technology used for the core network, the interval between wavelengths is mainly 200 GHz through 50 GHz (1.6 nm through 0.4 nm). In the near future, the interval will be made narrower still.

An oscillating wavelength of the LD is greatly influenced by temperature. Usually, a wavelength monitoring and controlling mechanism is provided in the interior of an optical transmitter module or an optical transmitter and receiver module. The wavelength monitoring and controlling mechanism feeds monitor output signals for monitoring and controlling wavelengths back to a temperature controller and carries out control so that the oscillating wavelengths are kept constant.

FIG. 12 is a general view of a prior art wavelength monitoring and controlling mechanism disclosed in, for example, "25 GHz-spacing wavelength monitor integrated DFB laser module" of Institute of Electronics, Information and Communication Engineers C-4-44, 2002, which was prepared by Takagi et.al., and the schematic shows one example of an optical system for monitoring and controlling wavelengths in which an etalon (or Fabry-Petrot optical resonator) is employed. In the drawing, reference number 12 denotes an optical fiber, 13 denotes a forward lens, 14 denotes a DFB-LD (a distributed feedback laser diode), 15 denotes a rearward lens, 16 denotes a prism, 17 denotes a temperature controller, 18 denotes an etalon, 19a and 19b denote optical detectors. A wavelength monitoring and controlling method using an etalon in an optical system for monitoring and controlling wavelengths is also disclosed in Japanese Patent Application Laid-open Nos. 2001-196689 and 2003-283044, and U.S. Pat. No. 6,353,623.

The DFB-LD 14 is installed centrally, and an optical transmission system for optical signals is shown at the arrow A side. A laser beam emitted from the forward end face is collimated by the forward lens 13 and is coupled into an optical fiber 12. On the other hand, an optical system for monitoring and controlling wavelengths of the DFB-LD 14 is shown at the side opposite to the arrow A. An LD beam emitted from the rearward end face is used for monitoring and controlling. The LD beam is collimated by the rearward lens 15 and is branched into two by the prism 16. One of the split LD beams is coupled directly to the optical detector 19a and the other thereof is made incident into the etalon 18. Output signal of the light made incident directly into the optical detector 19a are used for automatic optical output control.

Output signals made incident into two optical detectors 19a and 19b are used for monitoring and controlling wavelengths. Light passed through the etalon 18 is collimated and is made incident into the optical detector 19b. The resonator length of the etalon 18 is accurately adjusted so as to correspond to a wavelength to be monitored. Therefore, since the amount of outputted light changes in line with a fluctuation in the wavelength, a difference between the light amount and the output signal made incident into optical detector 19a is detected as a fluctuation in output of the optical detector 19b. The output is fed back to the temperature controller 17 of the LD light, thereby controlling the wavelength of the LD light. Thus, the wavelength is directly extracted in terms of hardware and is used for control.

On the other hand, a method for monitoring and controlling wavelengths, in which no etalon is employed for an optical system for monitoring and controlling wavelengths, has been developed. For example, in Japanese Patent Application Laid-open No. 1-235390(1989), a method for monitoring and controlling a wavelength, in which the relationship between an environmental temperature and a change in a wavelength (that is, an amount of wavelength deviation) is stored in advance and the temperature is controlled based on the relationship, is disclosed. In Japanese Patent Application Laid-open No. 2000-323785, a method for monitoring and controlling a wavelength, which stores in advance the data obtained by actually having measured the laser temperature with respect to the laser drive current and controls a laser drive current by predicting an actual amount of rise in temperature on the basis of the data, is disclosed as another example.

As described above, in order to suppress crosstalk which becomes a factor of signal deterioration, wavelength monitoring and controlling are indispensably necessary to stabilize the oscillating wavelength of a light source within the pass band of an optical coupling and splitting filter. However, where an optical filter such as an etalon is employed for a wavelength monitoring and controlling system, the optical system becomes expensive, and the number of assembling steps is increased, making it difficult to reduce the production costs. Also, since the etalon has temperature dependency (for example, Y. C. Chung et. al, "Synchronized etalon filters for standardizing WDM transmitter laser wavelength," IEEE Photon. Technol. Lett., Vol., pp. 186-189, February 1993), for example, a Peltier device is requisite. As a result, it is difficult to make the wavelength monitoring and controlling system small in size. In addition, there is still another problem in that, since the temperature adjusting feature operates at all times to secure a reference temperature, power consumption for adjusting the temperature becomes high.

On the other hand, in the method for monitoring and controlling a wavelength, which does not employ an etalon filter in a prior art optical system for monitoring and controlling a wavelength, for example, in the cases of Japanese Patent Application Laid-open Nos. 1-235390(1989) and 2000-323785, the temperature is controlled using the relationship between the environmental temperature stored in advance and a change in the wavelengths (that is, an amount of wavelength deviation) without directly calculating the wavelength. Therefore, where a change in the wavelength (that is, an amount of the wavelength deviation) depends on factors other than the temperature, sufficient monitoring and control cannot be secured.

DISCLOSURE OF THE INVENTION

The present invention was developed in order to solve such problems and shortcomings. It is therefore an object of the invention to provide an optical module and its wavelength monitoring and controlling method, enabling small size and low power consumption without requiring any complicated optical system in its wavelength monitoring and controlling mechanism. Further, it is another object of the invention to provide an optical module and its wavelength monitoring and controlling method which is capable of controlling a wavelength of light emitted from a laser diode (LD) to a desired value.

The invention was made in order to achieve the above-described objects. According to a first aspect of invention, an optical transmitter module or an optical transmitter and receiver module internally comprises: a measurement portion for measuring the temperature and bias current of a laser diode or only the temperature; a storage portion in which the relationship between the temperature and bias current and wavelengths or between only the temperature and wavelengths are stored; and a central controlling portion for controlling the measurement portion and the storage portion, wherein the wavelength is calculated on the basis of the relationship stored in the storage portion.

Also, according to a second aspect of the invention, a wavelength monitoring method in an optical transmitter module or an optical transmitter and receiver module internally comprising a measurement portion for measuring the temperature and bias current of a laser diode or only the temperature, a storage portion in which the relationship between the temperature and bias current and wavelengths or between only the temperature and wavelengths, and a central controlling portion for controlling the measurement portion and the storage portion, the method comprises the step of calculating wavelength information on the basis of the temperature and bias current or only the temperature measured by the measurement portion, and the relationship between the laser diode temperature and bias current and wavelengths or between the laser diode temperature and wavelengths stored in the storage portion.

Also, according to a third aspect of the invention, a method for monitoring and controlling wavelengths in an optical transmitter module or an optical transmitter and receiver module internally comprising a measurement portion for measuring the temperature and bias current of a laser diode or only the temperature, a storage portion in which the relationship between the temperature and bias current and wavelengths or between only the temperature and wavelengths, a central controlling portion for controlling the measurement portion and the storage portion, and a temperature adjusting portion composed of a temperature controlling device, the method comprises a wavelength information calculating step of calculating wavelength information on the basis of the temperature and bias current or the temperature measured by the measurement portion, and the relationship between the laser diode temperature and bias current and wavelengths or between the laser diode temperature and wavelengths stored in the storage portion, and a temperature controlling step of adjusting the internal temperature by using the calculated wavelength information to feed back to the temperature adjusting portion.

Thus, with respect to monitoring wavelengths and monitoring and controlling wavelengths by calculating the wavelengths on the basis of the relationship between the LD temperature and bias current and the wavelength and between the LD temperature and wavelengths stored in advance in the storage portion, since the system does not require any complicated optical system in which an etalon filter is used as in the prior art, the structure thereof can be simplified, and reduced size and cost can be expected. For example, even in a Coarse WDM (interval between wavelengths is 1000 GHz through 50 nm, ITU-TG. 694.2) which does not require wavelength monitoring and control, the use of such a wavelength monitoring feature improves reliability in operation management such as enabling a proactive measure against an emergent condition of a system, thus providing a great effect.

In addition, in terms of the wavelength monitoring and control, by associating the temperature adjustment feature with an external temperature, minimal operation required for the temperature adjustment feature can be achieved when the external temperature exceeds the minimum value or the maximum value of the wavelength threshold, whereby the power consumption can be decreased in comparison with a case where the temperature adjustment feature is operated at all times. Further, by using a temperature control feature, a dense WDM technology can be employed, making it possible to increase the number of wavelengths per a single core. Further, by storing, not a deviation from a predetermined wavelength, but the wavelength itself in a memory, it becomes possible to set an oscillating wavelength to any value within a variable range of the temperature adjusting portion.

As described above, according to the invention, wavelength monitoring is enabled by the measurement portion for measuring the temperature and bias current of a laser diode or only the temperature; the storage portion in which the relationship between the temperature and bias current and wavelengths or between only the temperature and wavelengths is stored; and the central controlling portion for controlling the measurement portion and storage portion. In addition, wavelength control is enabled by adding the temperature adjusting portion, which is composed of a temperature controlling device, inside the optical transmitter module or optical transmitter and receiver module. These technologies can be applied for size reduction and mass production, and expected to have a wavelength monitoring and controlling feature to be added to an optical transmitter module and an optical transmitter and receiver module.

Also, by associating the temperature adjustment feature with an external temperature, minimal operation required for the temperature adjustment feature can be achieved when the external temperature exceeds the minimum value or the maximum value of the wavelength threshold, whereby the power consumption can be decreased in comparison with a case where the temperature adjustment feature is operated at all times.

By using a wavelength monitoring method in an optical transmitter module or an optical transmitter and receiver module according to the invention, reliability in operation management can be improved by the wavelength monitoring feature. In addition, by using a wavelength monitoring and controlling method in an optical transmitter module or an optical transmitter and receiver module according to the invention, a highly dense WDM technology having narrow intervals between wavelengths can be introduced by the wavelength controlling feature, making it possible to increase the number of wavelengths per a single core in an optical system.

BRIEF DESCRIPTION OF THE DRAWINGS

FIG. 2A is a table showing the relationship between LD temperature and bias current and wavelengths;

FIG. 2B is a table showing the relationship between the LD temperature and wavelengths;

BEST MODE FOR CARRYING OUT THE INVENTION

Hereinafter, a description is given of embodiments of the invention with reference to the accompanying drawings.

Figure 1:
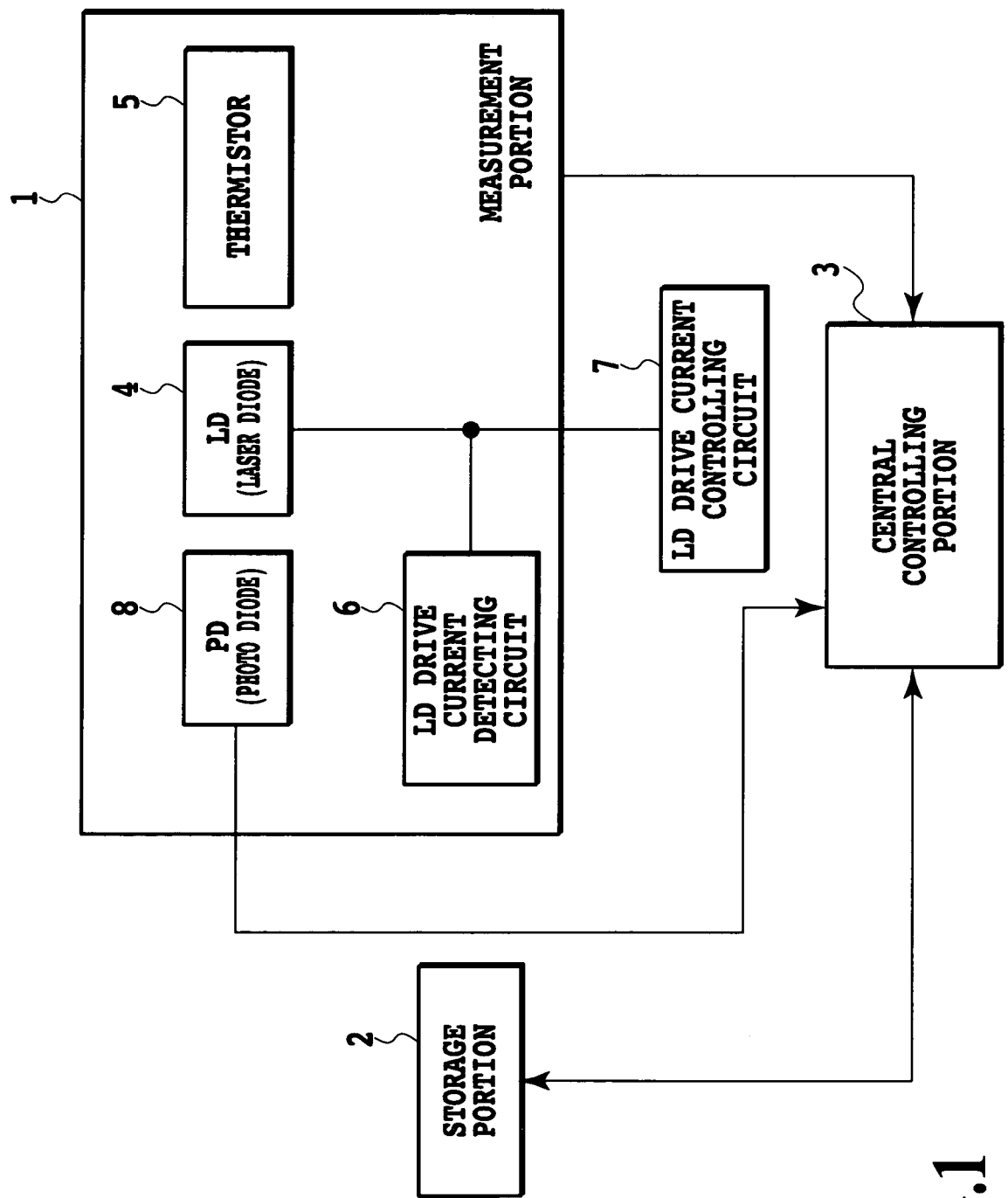
FIG. 1 is a block diagram of an optical module for monitoring wavelengths according to the invention.

An optical module according to a first embodiment is described below. FIG. 1 shows a configuration of a wavelength monitoring optical module according to the first embodiment. In the drawing, reference number 1 denotes a measurement portion, 2 denotes a storage portion, 3 denotes a central controlling portion, 4 denotes a laser diode (LD), 5 denotes a thermistor, 6 denotes an LD drive current detecting circuit, 7 denotes an LD drive current controlling circuit, and 8 denotes a photo diode (PD).

The measurement portion 1 measures the temperature by a thermistor 5 in the measurement portion 1, and measures the bias current by using the LD drive current detecting circuit 6, and further measures an optical output by the PD 8. In addition, the LD drive current controlling circuit 7 controls the bias current of the LD 4, and feeds it back via the central controlling portion 3 on the basis of the information of the bias current calculated by the measurement portion 1.

And, as shown in FIG. 2A and FIG. 2B, wavelengths are calculated by the central controlling portion 3 on the basis of the relationship (FIG. 2A) between the LD 4 temperature, bias current and wavelengths, or the relationship (FIG. 2B) between the LD 4 temperature and wavelengths, which are stored in the storage portion 2.

Generally, an oscillating wavelength can be linearly approximated by the LD 4 temperature and bias current. For example, the wavelength can be calculated by a linear interpolation method from the measured values of the temperature and bias current, using a data table such as shown in FIG. 2A.

$$\lambda = \lambda c + aT + b(i - ic) \quad (1)$$

where $\lambda c$ is a wavelength at temperature 0° C. and threshold current value ic, a and b are coefficients, T is a temperature, and i is a bias current.

For example, if the bias current is 80 mA and the temperature is 27° C., the wavelength becomes 1546.30 nm, wherein a=90 pm/° C. and b=3 pm/mA were employed. Also, since b is small, the wavelength may be calculated on the basis of only the relationship between the temperature and wavelength for simplification as shown below.

$$\lambda = \lambda c + aT \quad (2)$$

The wavelength may be calculated by another method described in detail later.

Figure 4:
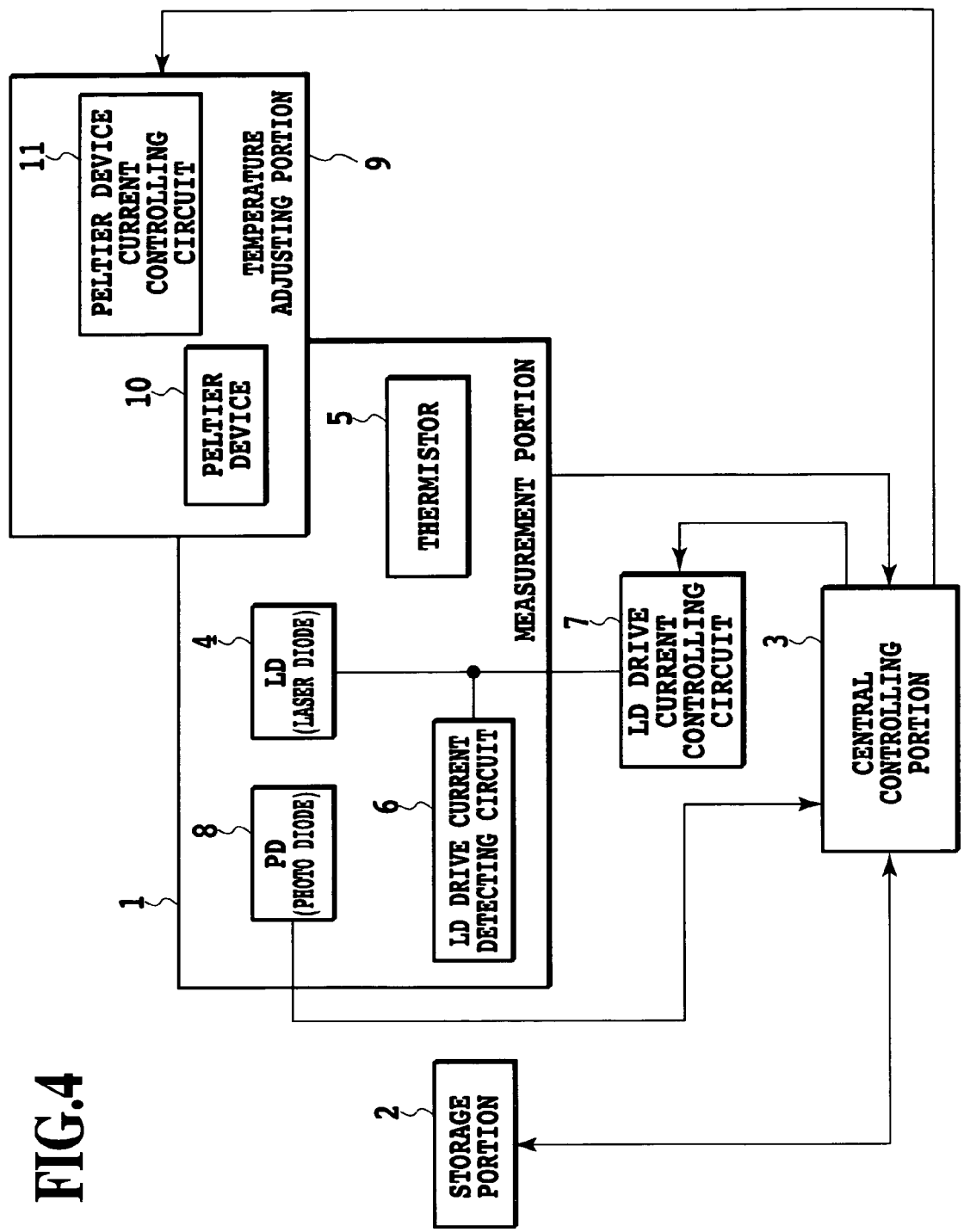
FIG. 4 is a block diagram of a wavelength monitoring and controlling optical module according to the invention.

FIG. 4 is a block diagram of a wavelength monitoring and controlling optical module according to the invention. In the drawing, reference number 9 denotes a temperature adjusting portion, 10 denotes a Peltier device, and 11 denotes a Peltier device current controlling circuit. In addition, components which have the same function as those in FIG. 1 are given the same reference numbers.

Wavelength monitoring and controlling are carried out by the Peltier device 10 and Peltier device current controlling circuit 11 in the temperature adjusting portion 9. Also, it is possible to carry out optical output control by using the PD 8 and LD drive current controlling circuit 7. That is, the wavelength monitoring and controlling optical module shown in FIG. 4 is such that the wavelength monitoring optical module shown in FIG. 1 is provided with the temperature adjusting portion 9 composed of a temperature controlling device and is also provided with a feature of feeding wavelength information calculated from the storage portion 2 back to the temperature adjusting portion 9.

Next, a description is given of a wavelength monitoring method in an optical transmitter module or optical transmitter and receiver module according to a second embodiment of the invention. By setting threshold values related to the wavelengths in the storage portion 2 and comparing the wavelengths calculated by the central controlling portion 3 with the threshold values, it becomes possible to issue an alarm or a warning with respect to wavelength deviation.

Figure 5:
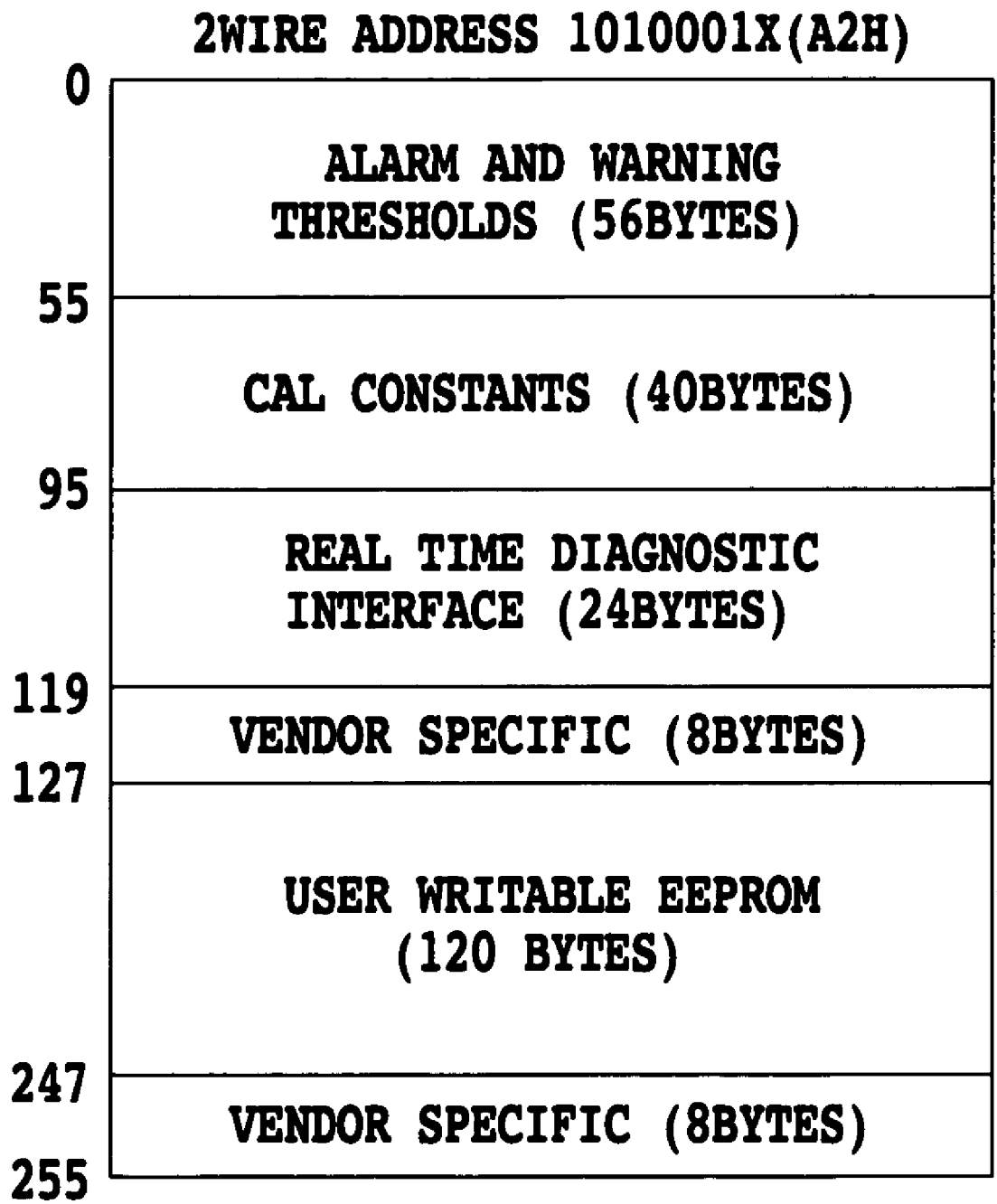
FIG. 5 shows a memory map internally incorporated in SFP.

As a detailed example, a description is given of a Small Form Factor Pluggable (SFP) in which an optical portion of a device is formed of a pluggable small-type optical transmitter and receiver module. With respect to the SFP, the wavelength monitoring method is defined in SFP-8472 Revision 9.3 by the SFP Committee. A memory map held by the SFP is illustrated in FIG. 5.

Herein, threshold values for the alarm and warning are established in an area of 56 bytes in the Alarm and Warning Thresholds addresses 0 through 55 of the storage portion 2. Temperature, optical transmission output, bias current of the LD, optical receiving input, and supply voltage are stored in an area of 24 bytes in the Real Time Diagnostic Interface addresses 95 through 119 of the storage portion 2, and two additional items can be stored, whereby all-time monitoring is enabled.

Herein, the LD temperature, bias current and optical output are measured by the measurement portion 1. Further, bits are assigned in the portion, which are prepared to transmit alarm or warning information to a peripheral interface if the alarm or warning thresholds are exceeded.

However, no wavelength information is included in the SFP. Therefore, it becomes possible to carry out wavelength monitoring by newly adding wavelength information to the place of the above-described additional items. With respect to the method for calculating wavelength information, the relationship between the LD temperature and wavelengths or between the LD temperature and bias current and wavelengths as shown in FIG. 2A and FIG. 2B are stored in advance from the measured values of LD (herein, DFB-LD) in a memory area of 120 bytes of the User Writable EEPROM addresses 127 through 247 or an extended memory of the storage portion 2. Further, the relationship between the LD temperature and wavelengths or between the temperature, bias current and wavelengths may not employ individual measurements but rather use a single representative value or a designed value although the accuracy is somewhat worsened.

And, a wavelength is calculated by the central controlling portion 3 on the basis of the temperature and bias current or the temperature information measured by the measurement portion 1 and the relationship between the LD temperature, bias current and wavelengths or between the temperature and wavelengths stored in the storage portion 2.

In addition, by setting the threshold values for wavelengths in the Alarm and Warning Thresholds of the storage portion 2, it becomes possible to issue an alarm or warning with respect to wavelength deviation by the central controlling portion 3.

Figure 3:
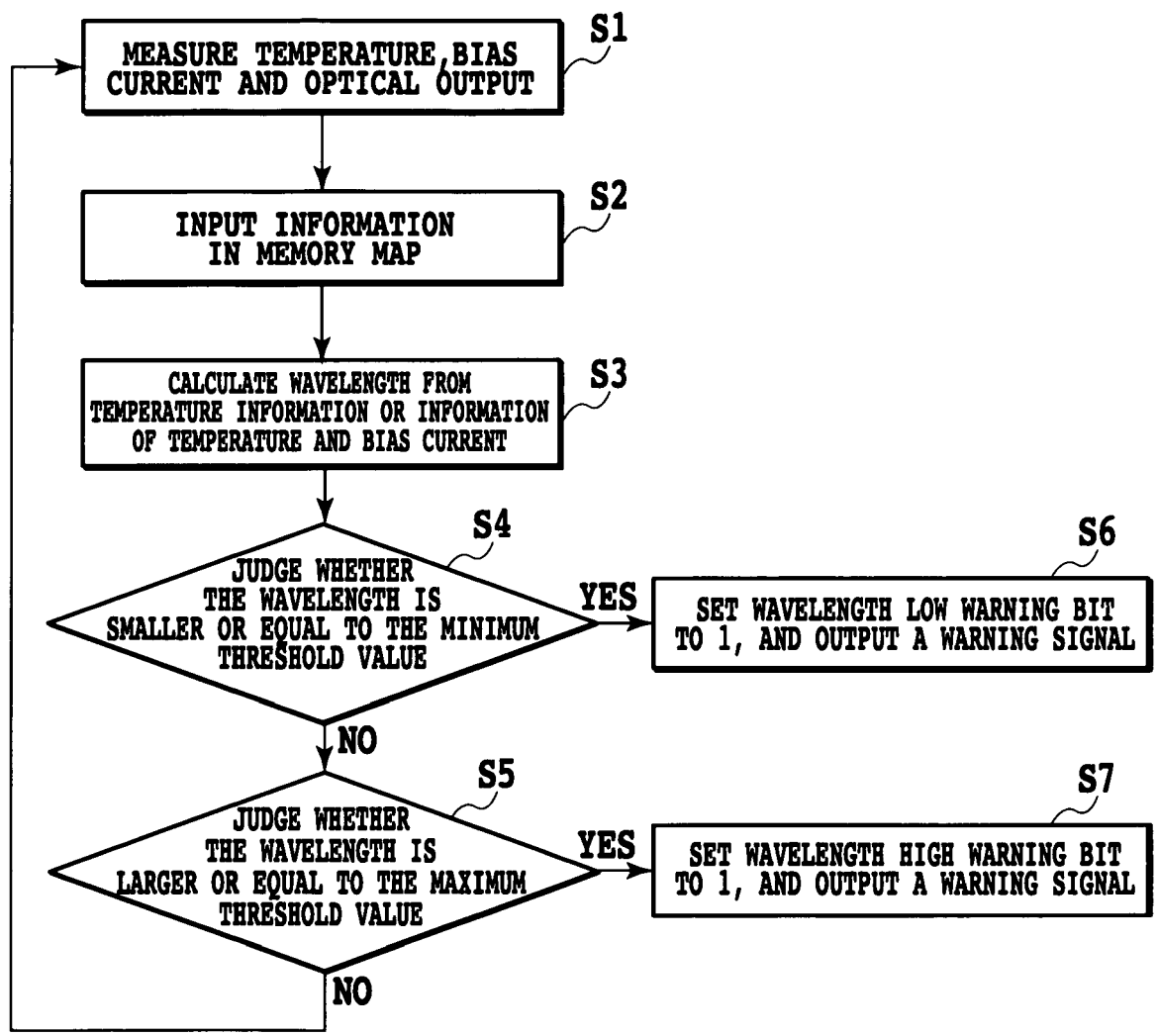
FIG. 3 is a flow chart showing a procedure of a wavelength monitoring method of an optical module according to the invention.

FIG. 3 is a flow chart showing the procedures of a wavelength monitoring method of an optical module according to the invention.

First, the temperature, bias current and optical output are measured by the measurement portion 1 (S1). Next, by mapping information of the measurement portion in the Real Time Diagnostic Interface of the storage portion 2 (S2), a wavelength is calculated (S3) by collating only the temperature information or the temperature and bias current information with the matrices in the User Writable EEPROM or extended memory portion.

Next, the minimum threshold value of a wavelength warning in the Alarm and Warning Thresholds of the storage portion 2 is compared with transmitted wavelength information (S4). If the transmitted wavelength information is smaller than or equal to the minimum threshold value of the wavelength warning, the Wavelength LOW warning bit in the Real Time Diagnostic Interface of the storage portion 2 is set to 1, and a warning signal is outputted to a peripheral interface, etc. (S6).

If the transmitted wavelength information exceeds the minimum threshold value of a wavelength warning, then it is compared with the maximum threshold value of the wavelength warning in the Alarm and Warning Thresholds of the storage portion 2 (S5). When the transmitted wavelength information is larger than or equal to the maximum threshold value of a wavelength warning, the Wavelength HIGH warning bit in the Real Time Diagnostic Interface of the storage portion 2 is set to 1, and a warning signal is outputted to a peripheral interface, etc. (S7). If it is smaller than or equal to the maximum threshold value of a wavelength warning, a status is set, in which no wavelength warning signal of the Real Time Diagnostic Interface of the storage portion 2 is outputted (that is, warning bit is 0), and the temperature, bias current and optical output are again measured by the measurement portion 1.

Figure 6:
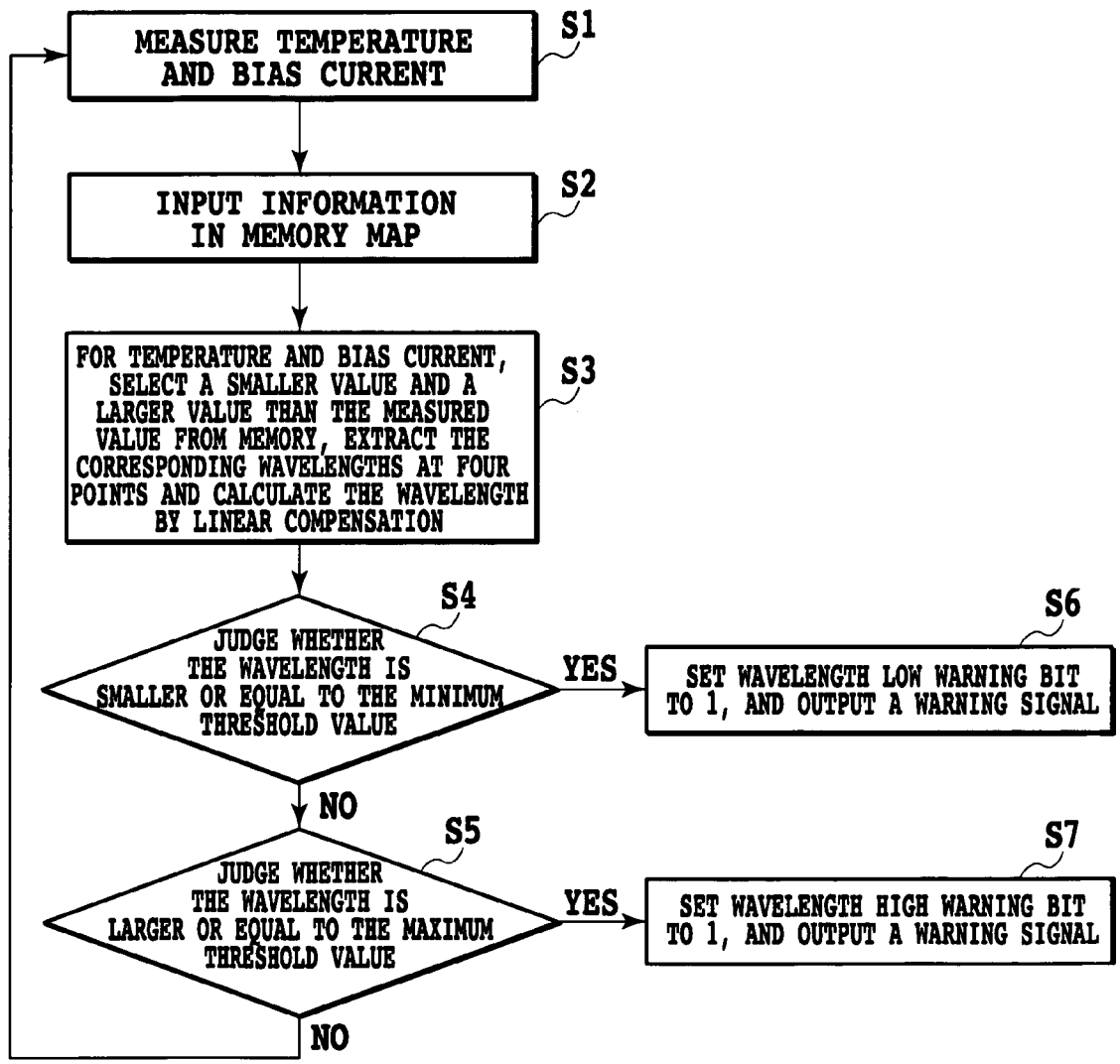
FIG. 6 is a flow chart to describe a wavelength monitoring procedure of a wavelength monitoring optical module according to the invention.

FIG. 6 is a flow chart showing another embodiment of the wavelength monitoring method in an optical transmitter module or optical transmitter and receiver module according to the invention. The embodiment differs from the wavelength monitoring method shown in FIG. 3 in terms of the wavelength calculating method (S3). The steps (S1, S2, and S4 through S7) other than S3 in FIG. 6 are the same as those in FIG. 3.

In the wavelength calculating method according to the embodiment shown in FIG. 3, coefficients of the equations (1) and (2) are obtained by collating only the measured temperature information or the temperature and bias current information with the matrices in the User Writable EEPROM or in the extended memory area. After that, the wavelength is calculated on the basis of the coefficients (S3). In the wavelength calculating method shown in FIG. 6, two temperature values which are a smaller value and a larger value than the measured temperature value, and two bias current values which are a smaller value and a larger value than the measured bias current information are selected from the matrices of a user writable EEPROM such as in FIG. 2A, and it is possible to calculate the wavelength by extracting wavelengths at the four points corresponding to these values (For example, four points nearest to the measured values of the temperature and bias current may be taken). In detail, it is possible to calculate the wavelengths by means of the measured temperature and bias current of the LD 4 and the selected four wavelengths from the relationship between the laser diode temperature, bias current and wavelengths stored in the storage portion 2.

Figure 7:
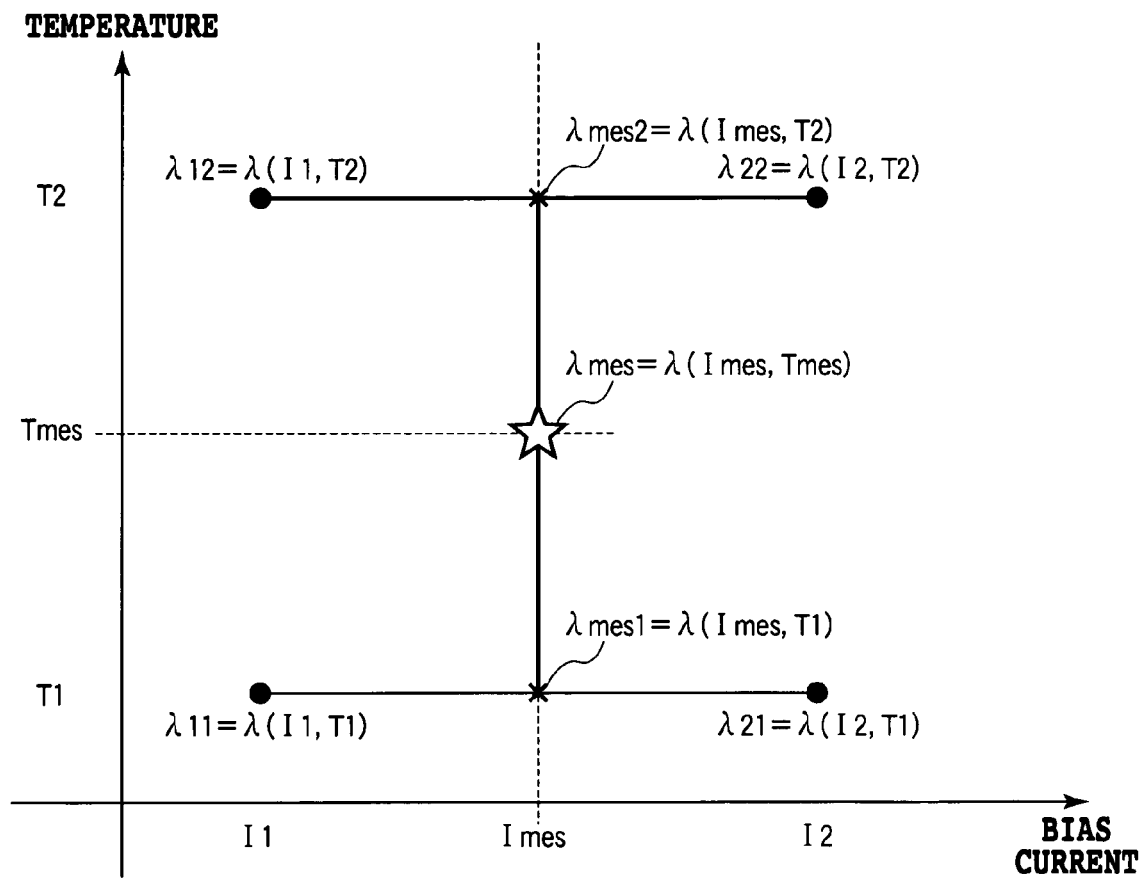
FIG. 7 is a graph to describe a wavelength calculating procedure according to the invention.

Referring to FIG. 7, a further detailed description is given below. First, a smaller temperature value T1 than the above measured temperature Tmes, a larger temperature value T2 than the above measured temperature Tmes, a smaller bias current value I1 than the above measured bias current Imes and a larger bias current value I2 than the above bias current value Imes are selected. And, the corresponding four wavelengths ($\lambda 11=\lambda(I1, T1)$, $\lambda 21=\lambda(I2, T1)$, $\lambda 12=\lambda(I1, T2)$, and $\lambda 22=\lambda(I2, T2)$ are extracted. Further, the bias current dependency of the wavelengths at temperature T1 is linearly interpolated by using $\lambda 11$ and $\lambda 21$, and the wavelength $\lambda mes1=\lambda$(Imes, T1) at Imes is calculated. Similarly, the bias current dependency of the wavelength at temperature T2 is linearly interpolated by using $\lambda 12$ and $\lambda 22$, and the wavelength $\lambda mes2=$(Imes, T2) at Imes is calculated. Finally, using the calculated $\lambda mes1$ and $\lambda mes2$, the temperature dependency of the wavelength at the bias current Imes is linearly interpolated, whereby making it possible to calculate the wavelength $\lambda mes=$(Imes, Tmes) at Imes and Tmes.

In addition, although the bias current dependency of wavelengths is linearly interpolated in the above method, another wavelength calculating method, in which the bias current dependency is approximated by such as a quadratic function in order to improve the calculation accuracy of wavelengths, may be employed. In detail, six wavelengths are first extracted from the storage portion 2. Four wavelengths ($\lambda 11=\lambda(I1, T1)$, $\lambda 21=\lambda(I2, T1)$, $\lambda 12=\lambda(I1, T2)$, and $\lambda 22=\lambda(I2, T2)$) are extracted as in the above-described method. By selecting the bias current I3 differing from the bias currents I1 and I2, the remaining two wavelengths ($\lambda 31=\lambda(I3, T1)$ and $\lambda 32=\lambda(I3, T2)$) are extracted. Next, the bias current dependency of wavelengths at temperature T1 is approximated by a quadratic function using $\lambda 11$, $\lambda 21$ and $\lambda 31$. The bias current dependency of wavelengths at temperature T2 is approximated by a quadratic function using $\lambda 12$, $\lambda 22$ and $\lambda 32$. It is thereby possible to calculate wavelength $\lambda mes=(Imes, Tmes)$ at Imes and Tmes.

Still another wavelength calculating method may be employed. For example, it is possible to calculate wavelengths by using matrices indicating the relationship between the laser diode temperature and wavelengths stored in the storage portion 2, or the relationship between the laser diode temperature, bias current and wavelengths. In this mode, the wavelengths are extracted by causing the measured value of temperature and measured value of the bias current to correspond to either one of the stored value of the temperature or stored values of the temperature and the bias current in the matrices.

Next, a description is given of a wavelength monitoring and controlling method in an optical transmitter module or an optical transmitter and receiver module according to a third embodiment.

Figure 8:
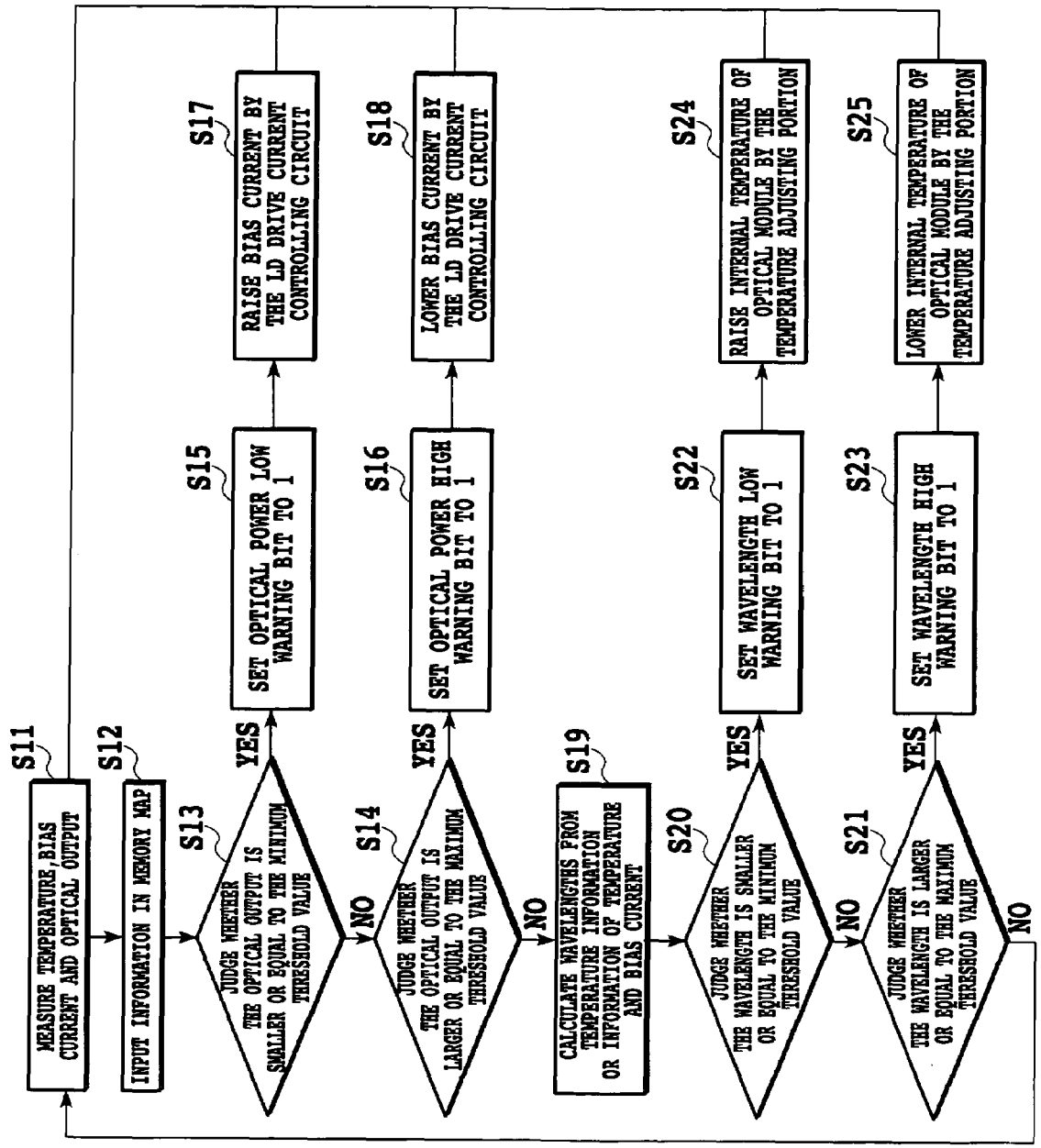
FIG. 8 is a flow chart to describe a wavelength monitoring and controlling method of a wavelength monitoring and controlling optical module according to the invention.

FIG. 8 is a flow chart showing a procedure to describe the wavelength monitoring and controlling method in an optical transmitter module or optical transmitter and receiver module according to the third embodiment. In detail, in the case of SFP, it is necessary to add a temperature adjusting portion.

First, the temperature, bias current and optical output are measured by the measurement portion 1 (S11). Next, by mapping (S12) in the Real Time Diagnostic Interface of the storage portion 2, the optical output is compared with the minimum threshold value of the optical output warning in the Alarm and Warning Thresholds of the storage portion 2 (S13). When the optical output is smaller than or equal to the minimum threshold value of the optical output warning, the Output Power LOW warning bit in the Real Time Diagnostic Interface of the storage portion 2 is set to 1 (S15). The information is transmitted to the LD drive current controlling circuit 7 to raise the bias current (S17). After the process is over, the temperature, bias current and optical output are again measured by the measurement portion 1.

When the optical output is larger than or equal to the minimum threshold value of the optical output warning, next, it is compared with the maximum threshold value of the optical output warning in the Alarm and Warning Thresholds of the storage portion 2 (S14). If the optical output is larger than or equal to the maximum threshold value of the optical output warning, the Output Power HIGH warning bit in the Real Time Diagnostic Interface of the storage portion 2 is set to 1 (S16). The information is transmitted to the LD drive current controlling circuit 7 to lower the bias current (S18). After the process is over, the temperature, bias current and optical output are again measured by the measurement portion 1.

The optical output control is carried out by the central controlling portion 3. Also, the increment step of the LD drive current controlling circuit 7 is set in accordance with required accuracy. And, if the optical output is smaller than or equal to the maximum threshold value of an optical output warning, a status is set, in which the optical output warning signal in the Real Time Diagnostic Interface of the storage portion 2 is not outputted (that is, the warning bit is set to 0), and the wavelength is calculated by collating only the temperature information or temperature and bias current information with the matrices in the User Writable EEPROM or the extended memory portion (S19).

Next, the minimum threshold value of wavelength warning in the Alarm and Warning Thresholds of the storage portion 2 is compared with the transmitted wavelength information (S20). When the wavelength information is smaller than or equal to the minimum threshold value of wavelength warning, the Wavelength LOW warning bit in the Real Time Diagnostic Interface of the storage portion 2 is set to 1 (S22). The information is transmitted to the temperature adjusting portion 9, and the internal temperature is raised by the temperature adjusting portion 9 (S24). After the process is over, the temperature, bias current and optical output are again measured by the measurement portion 1.

When the wavelength information is larger than or equal to the minimum threshold value of wavelength warning, next, it is compared with the maximum threshold value of wavelength warning in the Alarm and Warning Thresholds of the storage portion 2. When the wavelength information is larger than or equal to the maximum threshold value of wavelength warning, the Wavelength HIGH warning bit in the Real Time Diagnostic Interface of the storage portion 2 is set to 1 (S23). If the Wavelength HIGH warning bit in the Real Time Diagnostic Interface of the storage portion 2 is 1, the internal temperature is lowered by the temperature adjusting portion 9 (S25). After the process is over, the temperature, bias current and optical output are again measured by the measurement portion 1.

If the wavelength information is smaller than or equal to the maximum threshold value of wavelength warning, a status is set, in which the wavelength warning signal of the Real Time Diagnostic Interface of the storage portion 2 is not outputted (that is, the warning bit is 0). Again, the temperature, bias current and optical output are measured by the measurement portion 1.

The above-described wavelength control is carried out by the central controlling portion 3, including control of time constants, from varying the bias current or varying the temperature by the temperature adjusting portion 9 until each of the values to be settled. The increment step of the temperature adjusting portion 9 is set in accordance with required accuracy.

Figure 9:
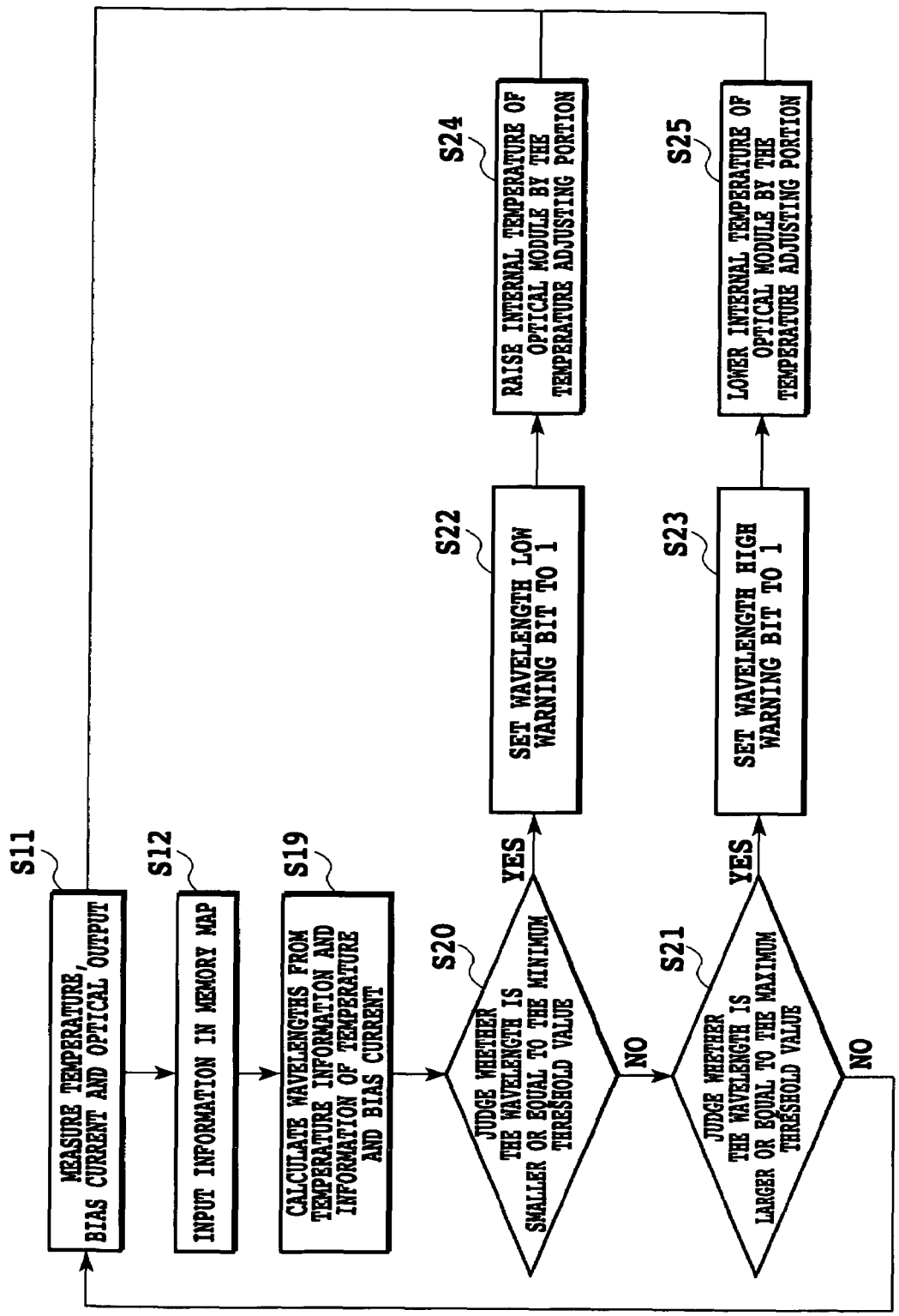
FIG. 9 is a flow chart to further simplify the wavelength monitoring and controlling procedure of the wavelength monitoring and controlling optical module according to the invention.

FIG. 9 is a flow chart for further simplifying a procedure of the wavelength monitoring and controlling method in an optical transmitter module or an optical transmitter and receiver module according to a third aspect of the invention. Determination (S13 through S18) with respect to the threshold values of the optical output may be omitted from the procedure of the wavelength monitoring and controlling method shown in FIG. 8.

Figure 10:
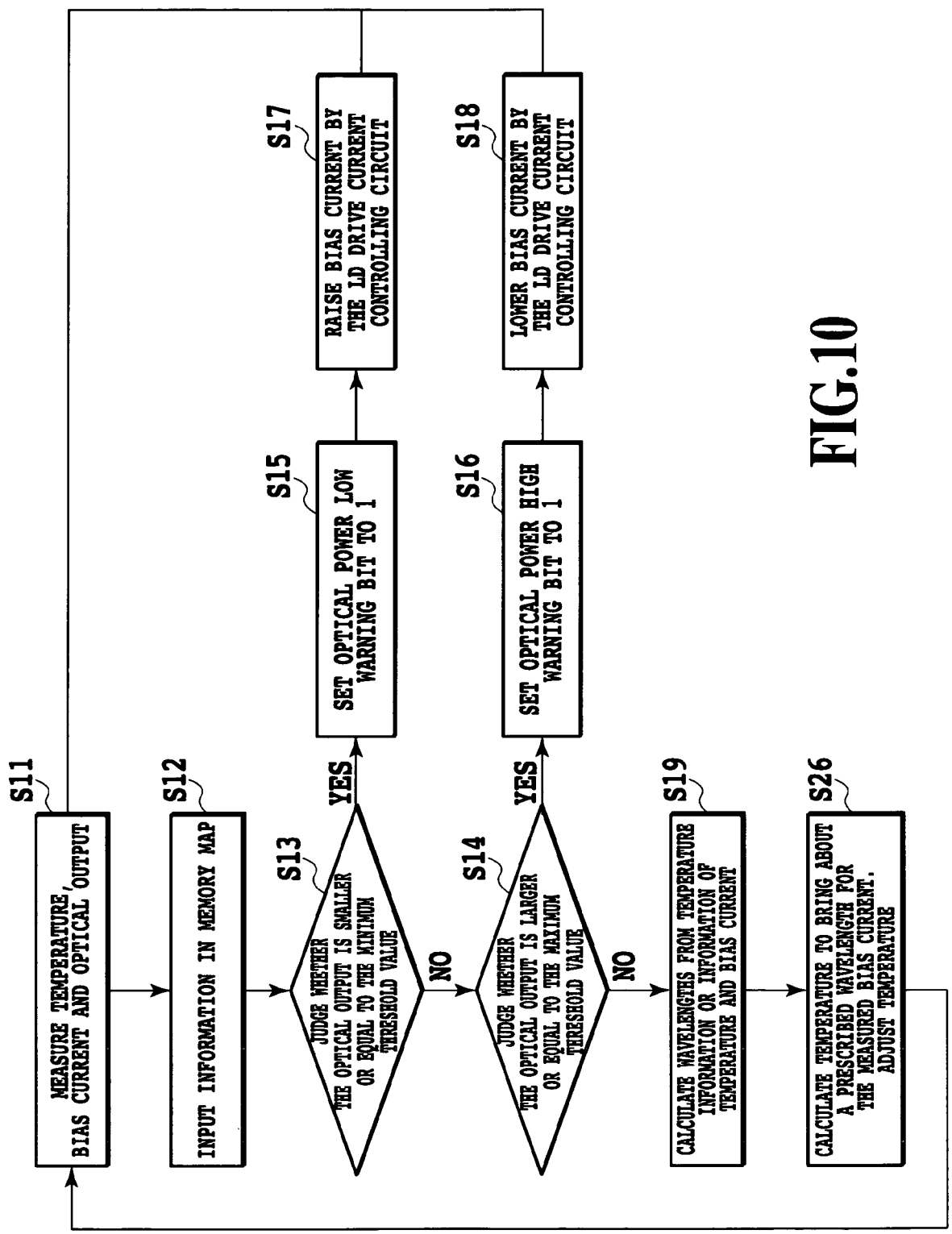
FIG. 10 is a flow chart to describe a wavelength monitoring and controlling procedure of the wavelength monitoring and controlling optical module according to the invention.

FIG. 10 is a flow chart showing another procedure of the wavelength monitoring and controlling method in an optical transmitter module or optical transmitter and receiver module according to the third aspect of the invention. A description is given below of the procedure shown in FIG. 10 while comparing it with the procedure shown in FIG. 8.

In the procedure shown in FIG. 8, the wavelength control (S20 through S25) determines whether the calculated wavelength is within or outside the range of the threshold values. If outside the threshold values, the alarm bit is set to 1, and the control information showing whether the temperature is raised or lowered is fed back to the temperature adjusting portion. In the procedure of the wavelength monitoring and controlling method shown in FIG. 10, a temperature to obtain a prescribed wavelength is calculated and is fed back to the temperature adjusting portion, whereby it becomes possible to control the wavelength in a highly stabilized state.

In detail, by collating only the measured temperature information or the temperature and bias current information with the matrices in the User Writable EEPROM or the extended memory portion, coefficients of the equation (1) or (2) are obtained, from which the wavelength is calculated. Next, in the measured bias current, the temperature value to give a prescribed wavelength is calculated from the equation (1) or (2), information is fed back by the temperature adjusting portion so that the calculated temperature value is obtained (S26). Thereby, the wavelength is fixed to a prescribed value.

Figure 11:
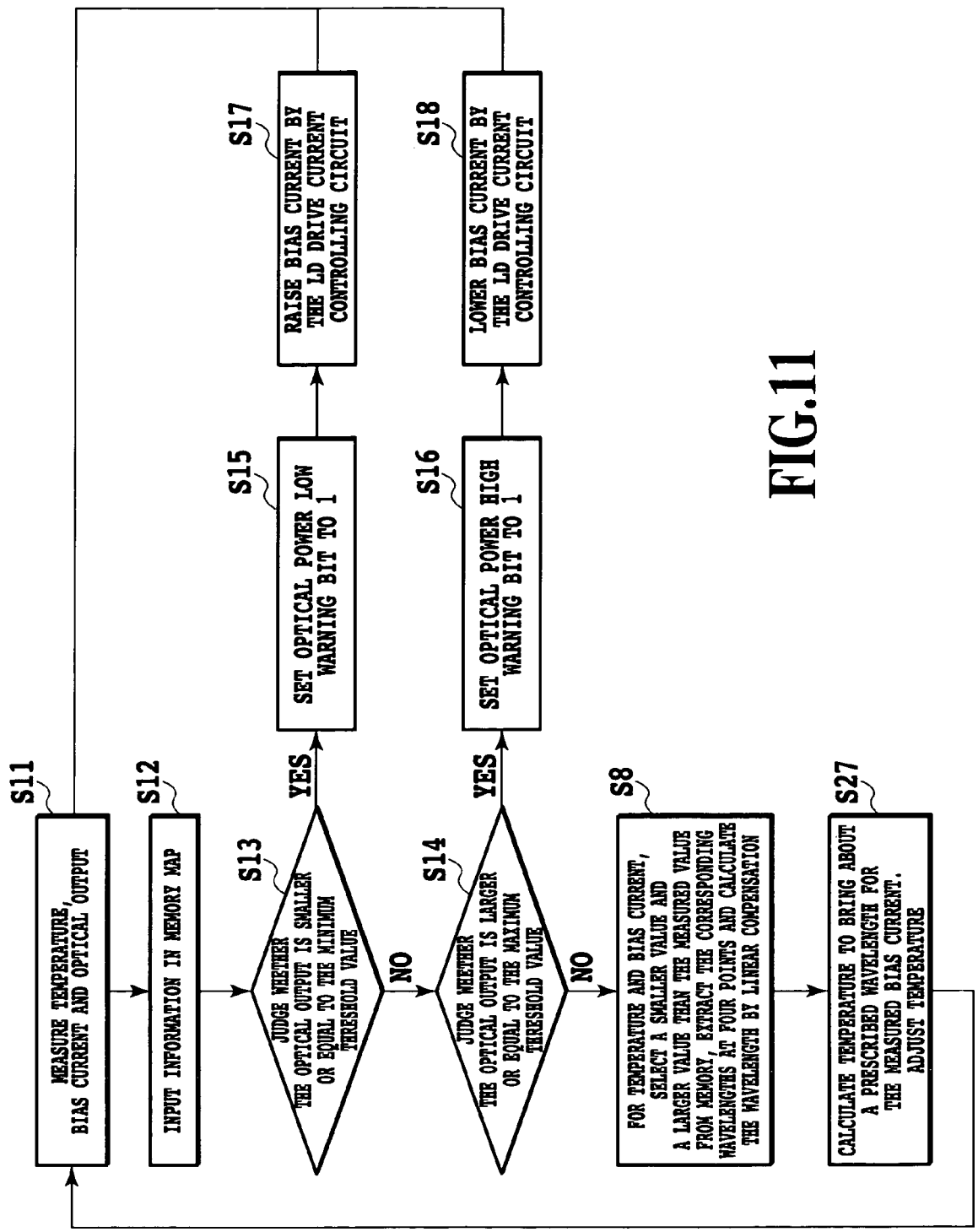
FIG. 11 is a flow chart to describe a wavelength monitoring and controlling procedure of the wavelength monitoring and controlling optical module according to the invention.
Figure 12:
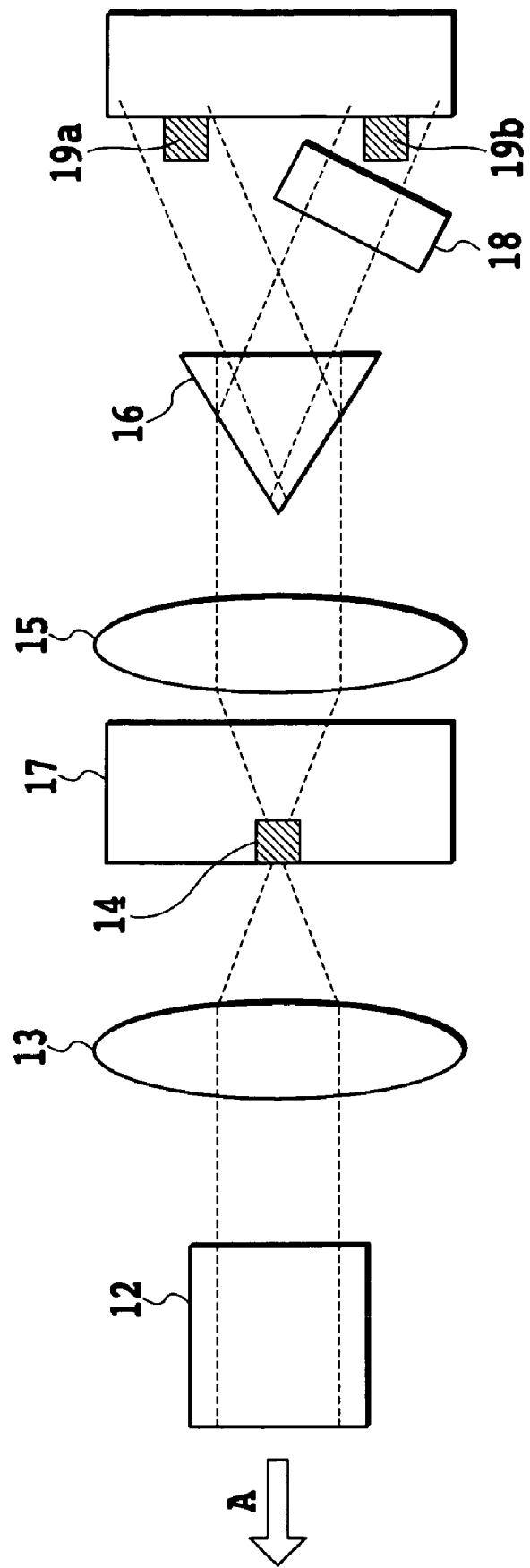
FIG. 12 is a schematic of a prior art wavelength monitoring and controlling mechanism.

FIG. 11 is a flow chart showing another procedure of the wavelength monitoring and controlling method in an optical transmitter module or optical transmitter and receiver module according to the third aspect of the invention. The procedure differs from the procedure shown in FIG. 8 in terms of the wavelength monitoring and controlling procedure.

In the procedure shown in FIG. 8, the wavelength control (S20 through S25) determines whether the calculated wavelength is within or outside the range of the threshold values, and the alarm bit is set to 1 only when the wavelength is outside the range, feeding back whether the temperature is raised or lowered by the temperature adjusting portion. In the wavelength monitoring and controlling procedure shown in FIG. 11, by feeding the control information to obtain a prescribed wavelength back to the temperature adjusting portion, the wavelength is controlled in a highly stabilized state. As described above, two temperatures, one of which is a smaller value than the measured temperature and the other of which is a larger value than the measured temperature, and two bias currents, one of which is a smaller value than the measured bias current and the other of which is larger than the measured bias current, are selected from the matrices of the User Writable EEPROM as shown in FIG. 2A. And, the wavelengths corresponding thereto are extracted at four points to calculate the wavelength (S8). Next, with respect to the measured bias current, the temperature value which gives a prescribed wavelength is calculated from the temperature dependency of the wavelength at the bias current Imes, and the information is fed back by the temperature adjusting portion so that the temperature becomes the calculated temperature value (S27), whereby the wavelength can be fixed to a prescribed value.

Herein, although the bias current dependency of the wavelength is linearly interpolated, as described above, it may be approximated by a quadratic function, etc., and the calculation accuracy of the wavelength can be improved. Further, by sufficiently increasing the number of elements of matrices (that is, number of data points) and always making the wavelength for the measured temperature and bias current coincident with one of the data points in the matrices, the calculation procedure based on linear interpolation may be omitted.

Also, herein, although the optical output and wavelength are adjusted by using the warning signal as a trigger, another given alarm signal may be used for adjustment as a trigger.

In addition, a feedback method described in the embodiment of the wavelength monitoring and controlling method in an optical transmitter module or an optical transmitter and receiver module according to the third aspect of the invention is not limited by whether or not there is a warning bit. Also, the wavelength monitoring and controlling method of an optical module according to the invention is not limited by the SFP. The method is applicable to all the optical modules comprising: a measurement portion for measuring the temperature and bias current or only the temperature in an optical transmitter module or an optical transmitter and receiver module; a storage portion in which the relationship between the LD temperature, bias current and wavelengths, or between the LD temperature and wavelengths is stored; and a temperature adjusting portion composed of a central controlling portion for controlling these components and a temperature controlling device.

Since the wavelength monitoring and controlling method stores, not fluctuation deviations from a prescribed wavelength, but the wavelengths themselves in its memory, it is possible to set a wavelength emitted from the LD to an any value in the temperature-variable range of the temperature adjusting portion, and the method may be used for a wavelength-varying light source.

The invention claimed is:

1. A method for monitoring and controlling wavelengths of an optical transmitter module or optical transmitter and receiver module internally including: a measurement portion for measuring a laser diode temperature and bias current or only the temperature; a storage portion in which the relationship between the temperature, bias current and wavelengths or between the temperature and wavelengths is stored; a central controlling portion for controlling the measurement portion and the storage portion; and a temperature adjusting portion composed of a temperature controlling device, wherein the method comprising steps of:

calculating wavelength information on the basis of the temperature and bias current or only the temperature measured by the measurement portion, and the relationship between the laser diode temperature and wavelengths or between the laser diode temperature, bias current and wavelengths stored in the storage portion;

comparing predetermined minimum and maximum threshold values, with the wavelength information calculated in the step of calculating wavelength information;

raising the internal temperature by the temperature adjusting portion when the result of the comparing step is smaller than or equal to the minimum threshold value; and lowering the internal temperature by the temperature adjusting portion when the result of the comparing step is larger than or equal to the maximum threshold value.

2. The method for monitoring and controlling wavelengths according to claim 1, wherein the step of calculating wavelength information uses the temperature and bias current or only the temperature measured by the measuring portion, and the relationship between the laser diode temperature and wavelengths or between the laser diode temperature, bias current and wavelengths stored in the storage portion, and calculates wavelength information by obtaining $\lambda c$, ic, a, and b in Equation (1) or $\lambda c$ and a in Equation (2);

$$\lambda = \lambda c + aT + b(i - ic) \quad \text{Equation (1)}$$

$$\lambda = \lambda c + aT \quad \text{Equation (2)}$$

where $\lambda c$ is a wavelength at temperature 0° C. and threshold current value ic, a and b are coefficients, T is a temperature, and i is a bias current.

3. The method for monitoring and controlling wavelengths according to claim 1, wherein the step of calculating wavelength information selects a smaller temperature value T1 than the measured temperature Tmes, a larger temperature value T2 than the measured temperature Tmes, a smaller bias current value I1 than the measured bias current Imes and a larger bias current value I2 than the bias current value Imes by using the temperature and bias current measured by the measurement portion, and the relationship between the laser diode temperature, bias current and wavelengths stored in the storage portion; extracts four wavelengths ($\lambda 11 = \lambda(I1, T1)$, $\lambda 21 = \lambda(I2, T1)$, $\lambda 12 = \lambda(I1, T2)$), and $\lambda 22 = \lambda(I2, T2)$ corresponding thereto; and calculates the wavelength $\lambda mes1 = \lambda(Imes, T1)$ at the measured bias current Imes by linearly interpolating the bias current dependency of the wavelengths at temperature T1 using $\lambda 11$ and $\lambda 21$; calculates the wavelength $\lambda mes2 = (Imes, T2)$ at the measured bias current Imes by linearly interpolating the bias current dependency of the wavelength at temperature T2 using λ12 and λ22; and calculates the wavelength λmes=(Imes, Tmes) at the measured bias current Imes and temperature Tmes by linearly interpolating the temperature dependency of the wavelength at the measured bias current Imes using the calculated λmes1 and λmes2.

4. The method for monitoring and controlling wavelengths according to claim 1, wherein the step of calculating wavelength information selects a smaller temperature T1 than the measured temperature Tmes, a larger temperature T2 than the measured temperature Tmes, a smaller bias current I1 than the measured bias current Imes, a larger bias current I2 than the measured bias current Imes, and a bias current I3 differing from the bias currents I1 and I2 by using the temperature and bias current measured by the measurement portion and the relationship between the laser diode temperature, bias current and wavelengths stored in the storage portion; extracts six wavelengths (λ11=λ(I1, T1), λ21=λ(I2, T1), λ12=λ(I1, T2), λ22=λ(I2, T2), λ31=λ(I3, T1)), and λ32=λ(I3, T2) corresponding thereto; approximates the bias current dependency of the wavelength at the temperature T1 by a quadratic function using λ11, λ21 and λ31; approximates the bias current dependency of the wavelength at the temperature T2 by a quadratic function using λ12, λ22 and λ32; and calculates the wavelength λmes=λ(Imes, Tmes) at the measured bias current Imes and temperature Tmes.

5. The method for monitoring and controlling wavelengths according to claim 1, wherein the step of calculating wavelength information extracts a wavelength by causing the measured temperature and bias current to correspond to any one of the temperatures stored in matrices indicating the relationship between the laser diode temperature and wavelengths or between the laser diode temperature, bias current and wavelengths stored in the storage portion.

6. The method for monitoring and controlling wavelengths according to any one of claims 1, 2, 3, 4, or 5, the method comprising, before the step of calculating wavelength information, steps of:

comparing predetermined minimum and maximum threshold values, with the optical output measured by the measurement portion;

raising the bias current by a laser diode drive current controlling circuit when the result of the comparing step is smaller than or equal to the minimum value of the threshold values; and lowering the bias current by the laser diode drive current controlling circuit when the result of the comparing step is larger than or equal to the maximum value of the threshold values.

* * * * *